United States Patent
Xiao et al.

(10) Patent No.: US 12,057,310 B2
(45) Date of Patent: Aug. 6, 2024

(54) FUNCTIONALIZED CYCLOSILAZANES AS PRECURSORS FOR HIGH GROWTH RATE SILICON-CONTAINING FILMS

(71) Applicant: VERSUM MATERIALS US, LLC, Tempe, AZ (US)

(72) Inventors: Manchao Xiao, Tempe, AZ (US); Matthew R MacDonald, Tempe, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 303 days.

(21) Appl. No.: 17/501,842

(22) Filed: Oct. 14, 2021

(65) Prior Publication Data

US 2022/0044929 A1    Feb. 10, 2022

Related U.S. Application Data

(62) Division of application No. 15/986,030, filed on May 22, 2018, now Pat. No. 11,177,127.

(51) Int. Cl.
| | |
|---|---|
| *H01L 21/02* | (2006.01) |
| *C07F 7/10* | (2006.01) |
| *C23C 16/34* | (2006.01) |
| *C23C 16/40* | (2006.01) |
| *C23C 16/455* | (2006.01) |
| *C23C 16/56* | (2006.01) |

(52) U.S. Cl.
CPC .......... *H01L 21/02222* (2013.01); *C07F 7/10* (2013.01); *C23C 16/345* (2013.01); *C23C 16/402* (2013.01); *C23C 16/45553* (2013.01); *C23C 16/56* (2013.01); *H01L 21/02126* (2013.01); *H01L 21/02164* (2013.01); *H01L 21/0217* (2013.01); *H01L 21/02216* (2013.01); *H01L 21/02274* (2013.01); *H01L 21/02277* (2013.01); *H01L 21/0228* (2013.01); *H01L 21/0234* (2013.01)

(58) Field of Classification Search
CPC ......... H01L 21/02222; H01L 21/02126; H01L 21/02164; H01L 21/0217; H01L 21/02216; H01L 21/02274; H01L 21/02277; H01L 21/0228; H01L 21/0234; C07F 7/10; C23C 16/345; C23C 16/402; C23C 16/45553; C23C 16/56; C23C 16/0272; C23C 16/401

See application file for complete search history.

(56) References Cited

U.S. PATENT DOCUMENTS

| | | |
|---|---|---|
| 3,444,127 A | 5/1969 | Breed et al. |
| 4,103,045 A | 7/1978 | Lesaicherre et al. |
| 4,719,125 A | 1/1988 | Anello |
| 5,413,813 A | 5/1995 | Cruse et al. |
| 5,424,095 A | 6/1995 | Clark et al. |
| 6,992,019 B2 | 1/2006 | Lee et al. |
| 7,084,076 B2 | 8/2006 | Park et al. |
| 7,125,582 B2* | 10/2006 | McSwiney ............ C23C 16/345 427/255.393 |
| 7,470,450 B2 | 12/2008 | McSwiney |
| 8,871,656 B2 | 10/2014 | Mallick et al. |
| 9,245,740 B2 | 1/2016 | Jang et al. |
| 2007/0287301 A1* | 12/2007 | Xu ..................... H01L 21/02164 257/E21.259 |
| 2010/0164057 A1 | 7/2010 | Hunks et al. |
| 2011/0262642 A1* | 10/2011 | Xiao ................. H01L 21/02271 427/255.394 |
| 2012/0291321 A1 | 11/2012 | Spiro |
| 2013/0295779 A1 | 11/2013 | Chandra et al. |
| 2013/0330482 A1 | 12/2013 | Leu et al. |
| 2014/0051264 A1 | 2/2014 | Mallick et al. |
| 2015/0126045 A1 | 5/2015 | Chatterjee et al. |
| 2015/0303056 A1 | 10/2015 | Varadarajan et al. |
| 2015/0376211 A1 | 12/2015 | Girard et al. |
| 2016/0032452 A1 | 2/2016 | Lee et al. |
| 2016/0379819 A1 | 12/2016 | Ren et al. |
| 2017/0335449 A1 | 11/2017 | Li et al. |

FOREIGN PATENT DOCUMENTS

| | | |
|---|---|---|
| CN | 107257867 A | 10/2017 |
| EP | 2363512 A1 | 9/2011 |
| EP | 2463404 A1 | 6/2012 |
| EP | 2363512 A1 | 7/2017 |
| JP | 06182902 | 1/1996 |
| JP | 2010225663 A2 | 10/2010 |
| JP | 2010275602 A2 | 12/2010 |
| TW | 201615880 A | 5/2016 |
| WO | 87/05298 A1 | 9/1987 |

(Continued)

OTHER PUBLICATIONS

Abel, E. W., et al., "Some New Alkylaminosilanes," J. Chem. Soc. (1964), vol. 26, pp. 1528-1530.

Andrianov, K. A., et al., "The reaction of a, w-dichlorodimethylsiloxanes with ethylamine," Bulletin of Academy of Sciences of the USSR, Division of Chemical Science, 1963, vol. 12, No. 10, pp. 1694-1697.

Brochon, Cyril, et al., "Equilibrium Anoinic Ring-Opening Polymerization of a Six-Membered Cyclosiloxazane," Macromolecules, 2007, vol. 40, pp. 3547-3553.

(Continued)

*Primary Examiner* — Shahed Ahmed
*Assistant Examiner* — Sun Mi Kim King
(74) *Attorney, Agent, or Firm* — David K. Benson

(57) ABSTRACT

Described herein are functionalized cyclosilazane precursor compounds and compositions and methods comprising same to deposit a silicon-containing film such as, without limitation, silicon oxide, silicon nitride, silicon oxynitride, silicon carbonitride, silicon oxycarbonitride, or carbon-doped silicon oxide via a thermal atomic layer deposition (ALD) or plasma enhanced atomic layer deposition (PEALD) process, or a combination thereof.

12 Claims, No Drawings

(56) References Cited

FOREIGN PATENT DOCUMENTS

| WO | 2015105337 | A1 | 7/2015 |
| WO | 2015190749 | A1 | 12/2015 |
| WO | 2016/065219 | A1 | 4/2016 |
| WO | 2016065219 | A1 | 4/2016 |

OTHER PUBLICATIONS

Burton, B. B., "SiO2 Atomic Layer Deposition Using Tris(dimethylamino)silane and Hydrogen Peroxide Studied by in Situ Transmission FTIR Spectroscopy," The Journal of Physical Chemistry (2009), 113, pp. 8249-8257.

Wannagut, U., et al. "Si-Chlor-oktamethyl-cyclotrisilazan und seine Derivative," Chemical Monthly, vol. 105, Aug. 26, 1974, pp. 1233-1339, XP93052489, Vienna ISSN: 0026-9247; DOI: 10/BF00909858.

Andrianov, K.A. "The Reaction of Dichlorodimethylsiloxanes with Ethylamine." Translated from Izvestiya Adademli Nauk SSSR, Seriya Khimicheskaya, No. 10, pp. 1847-1850, Oct. 1963.

Bochon, Cyril, et al. "Equilibrium Anionic Ring-Opening Polymerization of a Six-Membered Cyclosiloxazane." Macromolecules 2007, 40, 3547-3553.

Werner, Elisabeth, et al. "cyclotri- Und -Disilazane - isomere, bicyclen und Gekoppelte Ringe" Phosphorus, Sulfur, and Silicon, 1993, vol. 83, pp. 9-20.

\* cited by examiner

FUNCTIONALIZED CYCLOSILAZANES AS PRECURSORS FOR HIGH GROWTH RATE SILICON-CONTAINING FILMS

CROSS-REFERENCE TO RELATED APPLICATIONS

This application claim priority under 35 U.S.C. § 119(e) to U.S. provisional patent application No. 62/510,506, filed on May 24, 2017. This application is a Divisional of the parent application number U.S. Ser. No. 15/986,030, filed on May 22, 2018. The entirety of both which are incorporated herein by reference.

BACKGROUND OF THE INVENTION

Described herein are functionalized cyclosilazane precursor compounds and compositions and methods comprising same to deposit a silicon-containing film such as, without limitation, silicon oxide, silicon nitride, silicon oxynitride, silicon carbonitride, silicon oxycarbonitride, or carbon-doped silicon oxide via a thermal atomic layer deposition (ALD) or plasma enhanced atomic layer deposition (PEALD) process, or a combination thereof. More specifically, described herein is a composition and method for formation of a stoichiometric or a non-stoichiometric silicon-containing film or material at one or more deposition temperatures of about 600° C. or less including, for example, from about 25° C. to about 300° C.

Atomic Layer Deposition (ALD) and Plasma Enhanced Atomic Layer Deposition (PEALD) are processes used to deposit, for example, silicon oxide conformal films at low temperature (<500° C.). In both ALD and PEALD processes, the precursor and reactive gas (such as oxygen or ozone) are separately pulsed in certain number of cycles to form a sdemonolayer of silicon oxide at each cycle. However, silicon oxide deposited at low temperatures using these processes may contain levels of impurities such as, without limitation, nitrogen (N) which may be detrimental in certain semiconductor applications. To remedy this, one possible solution is to increase the deposition temperature to 500° C. or greater. However, at these higher temperatures, conventional precursors employed by semi-conductor industries tend to self-react, thermally decompose, and deposit in a chemical vapor deposition (CVD) mode rather than an ALD mode. The CVD mode deposition has reduced conformality compared to ALD deposition, especially for high aspect ratio structures which are needed in many semiconductor applications. In addition, the CVD mode deposition has less control of film or material thickness than the ALD mode deposition.

The reference article entitled "Some New Alkylaminosilanes," Abel, E. W. et al., J. Chem. Soc., (1961), Vol. 26, pp. 1528-1530 describes the preparation of various aminosilane compounds such as $Me_3SiNHBu$-iso, $Me_3SiNHBu$-sec, $Me_3SiN(Pr$-iso$)_2$, and $Me_3SiN(Bu$-sec$)_2$ wherein Me=methyl, Bu-sec=sec-butyl, and Pr-iso=isopropyl from the direct interaction of trimethylchlorosilane ($Me_3SiCl$) and the appropriate amine.

The reference article entitled "$SiO_2$ Atomic Layer Deposition Using Tris(dimethylamino)silane and Hydrogen Peroxide Studied by in Situ Transmission FTIR Spectroscopy," Burton, B. B., et al., The Journal of Physical Chemistry (2009), Vol. 113, pp. 8249-57 describes the atomic layer deposition (ALD) of silicon dioxide ($SiO_2$) using a variety of silicon precursors with $H_2O_2$ as the oxidant. The silicon precursors were (N,N-dimethylamino)trimethylsilane $(CH_3)_3SiN(CH_3)_2$, vinyltrimethoxysilane $CH_2CHSi(OCH_3)_3$, trivinylmethoxysilane $(CH_2CH)_3SiOCH_3$, tetrakis(dimethylamino)silane $Si(N(CH_3)_2)_4$, and tris(dimethylamino)silane (TDMAS) $SiH(N(CH_3)_2)_3$. TDMAS was determined to be the most effective of these precursors. However, additional studies determined that SiH* surface species from TDMAS were difficult to remove using only $H_2O$. Subsequent studies utilized TDMAS and $H_2O_2$ as the oxidant and explored $SiO_2$ ALD in the temperature range of 150-550° C. The exposures required for the TDMAS and $H_2O_2$ surface reactions to reach completion and were monitored using in situ FTIR spectroscopy. The FTIR vibrational spectra following the TDMAS exposures showed a loss of absorbance for O—H stretching vibrations and a gain of absorbance for C-Hx and Si—H stretching vibrations. The FTIR vibrational spectra following the $H_2O_2$ exposures displayed a loss of absorbance for C-Hx and Si—H stretching vibrations and an increase of absorbance for the O—H stretching vibrations. The SiH* surface species were completely removed only at temperatures >450° C. The bulk vibrational modes of $SiO_2$ were observed between 1000-1250 $cm^{-1}$ and grew progressively with number of TDMAS and $H_2O_2$ reaction cycles. Transmission electron microscopy (TEM) was performed after 50 TDMAS and $H_2O_2$ reaction cycles on $ZrO_2$ nanoparticles at temperatures between 150-550° C. The film thickness determined by TEM at each temperature was used to obtain the $SiO_2$ ALD growth rate. The growth per cycle varied from 0.8 Å/cycle at 150° C. to 1.8 Å/cycle at 550° C. and was correlated with the removal of the SiH* surface species. $SiO_2$ ALD using TDMAS and $H_2O_2$ should be valuable for SiO2 ALD at temperatures >450° C.

JP 2010275602 and JP 2010225663 disclose the use of a raw material to form a Si containing thin film such as, silicon oxide, by a chemical vapor deposition (CVD) process at a temperature range of from 300-500° C. The raw material is an organic silicon compound, represented by formula: (a) $HSi(CH_3)(R^1)(NR^2R^3)$, wherein, $R^1$ represents $NR^4R^5$ or a 1C-5C alkyl group; $R^2$ and $R^4$ each represent a 1C-5C alkyl group or hydrogen atom; and $R^3$ and $R^5$ each represent a $C_1$-$C_5$ alkyl group); or (b) $HSiCl(NR^1R^2)(NR^3R^4)$, wherein $R^1$ and $R^3$ independently represent an alkyl group having 1 to 4 carbon atoms, or a hydrogen atom; and $R^2$ and $R^4$ independently represent an alkyl group having 1 to 4 carbon atoms. The organic silicon compounds contained H—Si bonds.

U.S. Pat. No. 5,424,095 describes a method to reduce the rate of coke formation during the industrial pyrolysis of hydrocarbons, the interior surface of a reactor is coated with a uniform layer of a ceramic material, the layer being deposited by thermal decomposition of a non-alkoxylated organosilicon precursor in the vapor phase, in a steam containing gas atmosphere in order to form oxide ceramics.

U.S. 2012/0291321 describes a PECVD process for forming a high-quality Si carbonitride barrier dielectric film between a dielectric film and a metal interconnect of an integrated circuit substrate, comprising the steps of: providing an integrated circuit substrate having a dielectric film or a metal interconnect; contacting the substrate with a barrier dielectric film precursor comprising: $R_xR_y(NRR')_zSi$ wherein R, R', R and R' are each individually selected from H, linear or branched saturated or unsaturated alkyl, or aromatic group; wherein x+y+z=4; z=1 to 3; but R, R' cannot both be H; and where z=1 or 2 then each of x and y are at least 1; forming the Si carbonitride barrier dielectric film with C/Si ratio>0.8 and a N/Si ratio >0.2 on the integrated circuit substrate.

U.S. 2013/0295779 A describes an atomic layer deposition (ALD) process for forming a silicon oxide film at a deposition temperature >500° C. using silicon precursors having the following formula:

wherein $R^1$, $R^2$, and $R^3$ are each independently selected from hydrogen, a linear or branched $C_1$ to $C_{10}$ alkyl group, and a $C_6$ to $C_{10}$ aryl group; $R^4$ is selected from, a linear or branched $C_1$ to $C_{10}$ alkyl group, and a $C_6$ to $C_{10}$ aryl group, a $C_3$ to $C_{10}$ alkylsilyl group; wherein $R^3$ and $R^4$ are linked to form a cyclic ring structure or $R^3$ and $R^4$ are not linked to form a cyclic ring structure; X is a halide selected from the group consisting of Cl, Br and I; m is 0 to 3; n is 0 to 2; and p is 0 to 2 and m+n+p=3; and

wherein $R^1$ and $R^2$ are each independently selected from hydrogen, a linear or branched $C_1$ to $C_{10}$ alkyl group, and a $C_6$ to $C_{10}$ aryl group; $R^3$ and $R^4$ are each independently selected from a linear or branched $C_1$ to $C_{10}$ alkyl group, and a $C_6$ to $C_{10}$ aryl group; wherein $R^3$ and $R^4$ are linked to form a cyclic ring structure or $R^3$ and $R^4$ are not linked to form a cyclic ring structure; X is a halide atom selected from the group consisting of Cl, Br and I; m is 0 to 3; n is 0 to 2; q is 0 to 2 and p is 0 to 2 and m+n+q+p=3.

U.S. Pat. No. 7,084,076 discloses a halogenated siloxane such as hexachlorodisiloxane (HCDSO) that is used in conjunction with pyridine as a catalyst for ALD deposition below 500° C. to form silicon dioxide.

U.S. Pat. No. 6,992,019 discloses a method for catalyst-assisted atomic layer deposition (ALD) to form a silicon dioxide layer having superior properties on a semiconductor substrate by using a first reactant component consisting of a silicon compound having at least two silicon atoms, or using a tertiary aliphatic amine as the catalyst component, or both in combination, together with related purging methods and sequencing. The precursor used is hexachlorodisilane. The deposition temperature is between 25-150° C.

WO 2015/0105337 discloses novel trisilyl amine derivatives and a method for formation of silicon containing thin films, wherein the trisilyl amine derivatives are having thermal stability, high volatility, and high reactivity and being present in a liquid state at room temperature and under pressure where handling is possible, may form a high purity silicon containing thin film having excellent physical and electric properties by various deposition methods.

WO 2015/0190749 discloses novel amino-silyl amine compounds, $(Me_2NSiR^3R^4)N(SiHR^1R^2)_2$ ($R^1$—$R^4$=$C_{1-3}$ alkyl, $C_{2-3}$ alkenyl, $C_{2-3}$ alkynyl, $C_{3-7}$ cycloalkyl, $C_{6-12}$ aryl, etc.), and a method of a dielectric film containing Si—N bond. Since the amino-silyl amine compd. according to the present invention, which is a thermally stable and highly volatile compound, may be treated at room temperature and used as a liquid state compd. at room temp. and pressure, the present invention provides a method of a high purity dielectric film containing a Si—N bond even at a low temperature and plasma condition by using atomic layer deposition (PEALD).

U.S. Pat. No. 9,245,740 provides novel amino-silyl amine compounds, a method for preparing the same, and a silicon-containing thin-film using the same, wherein the amino-silyl amine compound has thermal stability and high volatility and is maintained in a liquid state at room temperature and under a pressure where handling is easy to thereby form a silicon-containing thin-film having high purity and excellent physical and electric properties by various deposition methods.

U.S. 2015/0376211A discloses mono-substituted TSA precursor Si-containing film forming compositions are disclosed. The precursors have the formula: $(SiH_3)_2N$—$SiH_2$—X, wherein X is selected from a halogen atom; an isocyanato group; an amino group; an N-containing $C_4$-$C_{10}$ saturated or unsaturated heterocycle; or an alkoxy group. Methods for forming the Si-containing film using the disclosed mono-substituted TSA precursor are also disclosed.

U.S. Pat. No. 3,444,127 describes the synthesis of polymeric arene-linked silicones by reacting functionalized 1,3-dioxa-5-aza-trisilacyclohexanes with arene-linked silanols and heating the mixture to as high as 180° C.

U.S. Pat. Nos. 5,413,813 and 5,424,095 describe the use of different hexamethylcyclotrisilazanes and other silazanes to coat the metal or metal oxide surfaces inside a reactor chamber with a ceramic material at high temperatures in order to prevent coking in subsequent reactor processes involving the pyrolysis of hydrocarbons.

US2015126045A1 describes the deposition of silicon nitride layer on a substrate by using a remote plasma and hexamentylcyclotrisilazane or other aminosilanes in a plasma-enhanced CVD process at temperatures less than 300° C.

US2016379819A1 describes the use of a UV-assisted photochemical vapor comprising different silazanes including hexamethylcyclotrisilazane for the purpose of pore-sealing pourous low-dielectric films.

US20130330482A1 describes the deposition of carbon-doped silicon nitride films via plasma-enhanced CVD process using vinyl-substituted cyclotrisilazanes or other silazanes as precursors.

US20160032452A1 describes an ALD process in which at least one metal organic source molecule is reacted with hydrogen radicals and another source gas to produce metal-containing films.

The previously identified patents, patent applications and publications are hereby incorporated by reference.

There is a need in this art for a process for forming uniform and conformal silicon-containing films such as silicon oxide having at least one or more of the following attributes: a density of about 2.1 g/cc or greater, a growth rate of 2.0 Å/cycle or greater, low chemical impurity, and/or high conformality in a thermal atomic layer deposition, a plasma enhanced atomic layer deposition (ALD) process or a plasma enhanced ALD-like process using cheaper, reactive, and more stable silicon precursor compounds.

BRIEF SUMMARY OF THE INVENTION

The instant invention solves the need in this art by providing compositions and processes for the deposition of a stoichiometric or nonstoichiometric silicon-containing material or film, such as without limitation, a silicon oxide, a carbon doped silicon oxide, a silicon oxynitride film, silicon nitride, a carbon doped silicon nitride, or a carbon doped silicon oxynitride film at relatively low temperatures, e.g., at one or more temperatures of 600° C. or lower, in the following deposition process: a plasma enhanced ALD, plasma enhanced cyclic chemical vapor deposition (PECCVD), a flowable chemical vapor deposition (FCVD), a plasma enhanced flowable chemical vapor deposition (PEFCVD), a plasma enhanced ALD-like process, or an ALD process with oxygen-containing reactant source, a nitrogen-containing reactant source, or a combination thereof.

In one aspect, there is provided a silicon precursor compound according to one of Formulae A, B, C, D, or E:

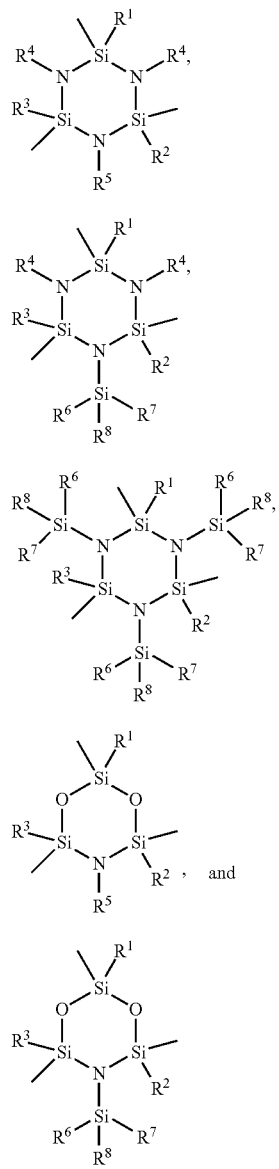

wherein $R^{1-3}$ are each independently selected from the group consisting of hydrogen, methyl, and an organoamino group (NR'R"), wherein R' and R" are each independently selected from the group consisting of hydrogen, a $C_{1-10}$ linear alkyl group, a $C_{3-10}$ branched alkyl group, a $C_{3-10}$ cyclic alkyl group, a $C_{2-10}$ alkenyl group, a $C_{4-10}$ aryl group, and a $C_{4-10}$ heterocyclic group, with the proviso that R' and R" cannot both be hydrogen; $R^4$ and $R^5$ are each independently selected from the group consisting of hydrogen, a $C_{1-10}$ linear alkyl group, a $C_{3-10}$ branched alkyl group, a $C_{3-10}$ cyclic alkyl group, a $C_{2-10}$ alkenyl group, a $C_{4-10}$ aryl group, and a $C_{4-10}$ heterocyclic group; $R^{6-8}$ are each independently selected from the group consisting of hydrogen, methyl, an organoamino group (NR'R") as defined above, a $C_{3-10}$ branched alkyl group, a $C_{3-10}$ cyclic alkyl group, a $C_{2-10}$ alkenyl group, a $C_{4-10}$ aryl group, and a $C_{4-10}$ heterocyclic group, with the proviso that R' and R" cannot both be hydrogen, wherein two or more of substituents $R^{1-8}$, R', and R" may be linked to form a substituted or unsubstituted, saturated or unsaturated, cyclic group, and wherein at least one of $R^{6-8}$ must be hydrogen, and at least two of $R^{6-8}$ must not be methyl.

In addition to conventional methods of synthesizing silazane molecules such as the reaction of chlorosilanes with amines or metal amides to form Si—N bonds, compounds having Formulae A to E can be synthesized, for example, by catalytic dehydrocoupling between at least one N—H bond of an organoamine, linear silazane or cyclosilazane moiety with a hydridosilane having at least one Si—H group (e.g. Equations 1-5).

(1)

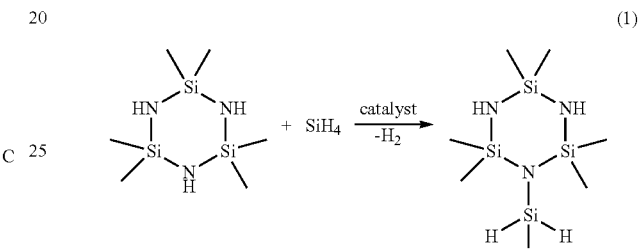

(2)

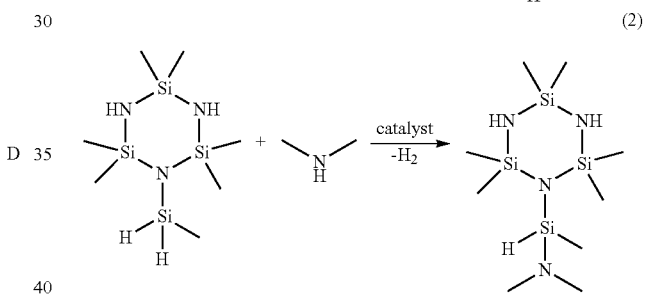

(3)

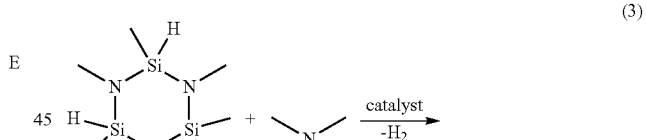

(4)

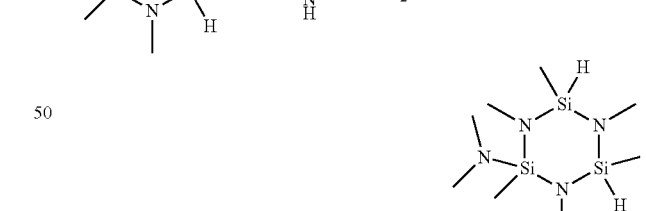

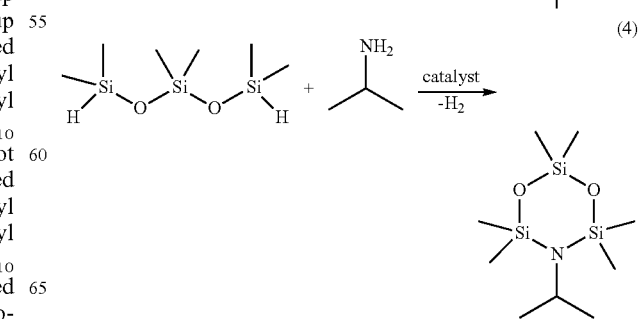

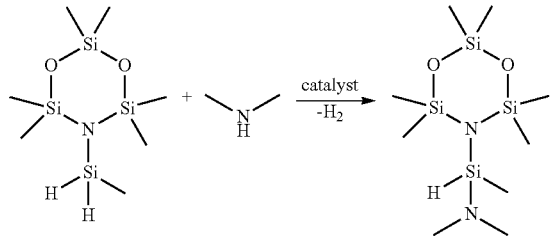

(5)

Exemplary dehydrocoupling catalysts include, but are not limited to, tris(pentafluorophenyl)borane, BR₃ (wherein R is selected from a linear, branched, or cyclic $C_1$ to $C_{10}$ alkyl group group, a $C_5$ to $C_{10}$ aryl group, or a $C_1$ to $C_{10}$ alkoxy group), 1,3-diisopropyl-4,5-dimethylimidazol-2-ylidene, 2,2'-bipyridyl, phenanthroline, Mg[N(SiMe₃)₂]₂, [tris(4,4-dimethyl-2-oxazolinyl)phenylborate]MgMe, [tris(4,4-dimethyl-2-oxazolinyl)phenylborate]MgH, trimethylaluminium, triethylaluminum, aluminum chloride, Ca[N(SiMe₃)₂]₂, dibenzylcalcium, {CH—[CMeNC₆H₃-2,6-ⁱPr₂]₂}CaH, triruthenium dodecacarbonyl, {CH—[CMeNC₆H₃-2,6-ⁱPr₂]2}Ca[N(SiMe₃)₂], bis(cyclopentadienyl)dialkylltitanium(IV), bis(cylopentadienyl)titanium(IV) difluoride, bis(cylopentadienyl)titanium(IV)dichloride, bis(cylopentadienyl)titanium(IV)dihydride, TiMe₂(dmpe)₂ [dmpe=1,2-bis(dimethylphosphino)ethane], (C₅H₅)₂Ti(OAr)₂ [Ar=(2,6-(iPr)₂C₆H₃)], (C₅H₅)₂Ti(SiHRR')PMe₃ [wherein R, R' are each independently selected from a hydrogen atom (H), a methyl group (Me), and a phenyl (Ph) group], bis(benzene) chromium(0), chromium hexacarbonyl, dimanganese decacarbonyl, [Mn(CO)₄Br]₂, iron pentacarbonyl, (C₅H₅)Fe(CO)₂Me, dicobalt octacarbonyl, nickel (II) acetate, nickel(II) chloride, [(dippe)Ni(μ-H)]₂ [dippe=1, 2-bis(diisopropylphosphino)ethane], (R-indenyl)Ni(PR'₃)Me [wherein R is selected from 1-i-Pr, 1-SiMe₃, and 1,3-(SiMe₃)₂; wherein R' is selected from a methyl (Me) group and a phenyl (Ph) group], [{Ni(η-CH₂:CHSiMe₂)₂O}₂{μ-(η-CH₂:CHSiMe₂)₂O}], nickel(II) acetylacetonate, ni(cyclooctadiene)₂, copper(II) fluoride, copper(I) chloride, copper(II) chloride, copper(I) bromide, copper(II) bromide, copper(I) iodide, copper(I) acetate, Cu(PPh₃)₃Cl, zinc chloride, [tris(4,4-dimethyl-2-oxazolinyl)phenylborate]ZnH, Sr[N(SiMe₃)₂]₂, Bis(cyclopentadienyl)dialkyllzirconium (IV), Bis(cyclopentadienyl)zirconium(IV)difluoride, Bis(cyclopentadienyl)zirconium(IV)dichloride, bis(cylopentadienyl)zirconium(IV)dihydride, [(Et₃P)Ru(2,6-dimesitylthiophenolate)][B[3,5-(CF₃)₂C₆H₃]₄], (C₅Me₅)Ru (R₃P)ₓ(NCMe)₃₋ₓ]⁺ (wherein R is selected from a linear, branched, or cyclic $C_1$ to $C_{10}$ alkyl group and a $C_5$ to $C_{10}$ aryl group; x=0, 1, 2, 3), tris(triphenylphosphine) rhodium(I) carbonyl hydride, di-μ-chloro-tetracarbonyldirhodium(I), tris(triphenylphosphine) rhodium(I) chloride (Wilkinson's Catalyst), hexarhodium hexadecacarbonyl, tris(triphenylphosphine)rhodium(I) carbonyl hydride, bis(triphenylphosphine)rhodium(I) carbonyl chloride, [RhCl(cyclooctadiene)]₂, tris(dibenzylideneacetone)dipalladium(0), tetrakis(triphenylphosphine)palladium(0), palladium(II) acetate, palladium(II) chloride, palladium(II) iodide, cesium carbonate, (C₅H₅)₂SmH, (C₅Me₅)₂SmH, (NHC)Yb(N(SiMe₃)₂)₂ [NHC=1,3-bis(2,4,6-trimethylphenyl)imidazol-2-ylidene], tungsten hexacarbonyl, dirhenium decacarbonyl, triosmium dodecacarbonyl, tetrairidium dodecacarbonyl, (acetylacetonato) dicarbonyliridium(I), (POCOP)IrHCl [(POCOP)=2,6-(R₂PO)₂C₆H₃, (R is selected from isopropyl (ⁱPr), normal butyl (ⁿBu), and methyl (Me)], Ir(Me)₂(C₅Me₅)L [wherein L is selected from PMe₃ and PPh₃], [Ir(cyclooctadiene)OMe]₂, platinum(0)-1, 3-divinyl-1,1,3,3-tetramethyldisiloxane (Karstedt's Catalyst), H₂PtCl₆.nH₂O (chloroplatinic acid), bis(tri-tert-butylphosphine)platinum(0), PtO₂, and Pt(cyclooctadiene)₂.

Catalysts can also be the present affixed to a support. The support is a solid with a high surface area. Typical support materials include but are not limited to: alumina, MgO, zeolites, carbon, Monolith cordierite, diatomaceous earth, silica gel, silica/alumina, ZrO and TiO₂. Preferred supports are carbon (for examples, platinum on carbon, palladium on carbon, rhodium on carbon, ruthenium on carbon) alumina, silica and MgO. Metal loading of the catalyst ranges between about 0.01 weight percent to about 50 weight percent. A preferred range is about 0.5 weight percent to about 20 weight percent. A more preferred range is about 0.5 weight percent to about 10 weight percent. Catalysts requiring activation may be activated by a number of known methods. Heating the catalyst under vacuum is a preferred method. The catalyst may be activated before addition to the reaction vessel or in the reaction vessel prior adding the reactants. The catalyst may contain a promoter. Promoters are substances which themselves are not catalysts, but when mixed in small quantities with the active catalysts increase their efficiency (activity and/or selectivity). Promoters are usually metals such as Mn, Ce, Mo, Li, Re, Ga, Cu, Ru, Pd, Rh, Ir, Fe, Ni, Pt, Cr, Cu and Au and/or their oxides. They can be added separately to the reactor vessel or they can be part of the catalysts themselves. For example, Ru/Mn/C (ruthenium on carbon promoted by manganese) or Pt/CeO₂/Ir/SiO₂ (Platinum on silica promoted by ceria and iridium). Some promoters can act as catalyst by themselves but their use in combination with the main catalyst can improve the main catalyst's activity. A catalyst may act as a promoter for other catalysts. In this context, the catalyst can be called a bimetallic (or polymetallic) catalyst. For example, Ru/Rh/C can be called either ruthenium and rhodium on carbon bimetallic catalyst or ruthenium on carbon promoted by rhodium. An active catalyst is a material that acts as a catalyst in a specific chemical reaction.

In another embodiment, there is provided a method for depositing a silicon-containing film onto a substrate which comprises the steps of: providing a substrate in a reactor; introducing into the reactor at least one silicon precursor compound comprising at least one silicon precursor compound according to one of Formulae A, B, C, D, or E:

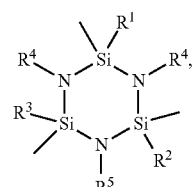

A

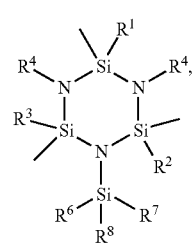

B

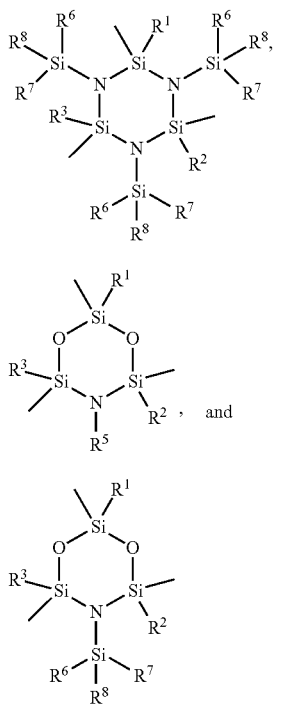

wherein R$^{1-3}$ are each independently selected from the group consisting of hydrogen, methyl, and an organoamino group (NR'R"), wherein R' and R" are each independently selected from the group consisting of hydrogen, a C$_{1-10}$ linear alkyl group, a C$_{3-10}$ branched alkyl group, a C$_{3-10}$ cyclic alkyl group, a C$_{2-10}$ alkenyl group, a C$_{4-10}$ aryl group, and a C$_{4-10}$ heterocyclic group, with the proviso that R' and R" cannot both be hydrogen; R$^4$ and R$^5$ are each independently selected from the group consisting of hydrogen, a C$_{1-10}$ linear alkyl group, a C$_{3-10}$ branched alkyl group, a C$_{3-10}$ cyclic alkyl group, a C$_{2-10}$ alkenyl group, a C$_{4-10}$ aryl group, and a C$_{4-10}$ heterocyclic group; R$^{6-8}$ are each independently selected from the group consisting of hydrogen, methyl, an organoamino group (NR'R") as defined above, a C$_{3-10}$ branched alkyl group, a C$_{3-10}$ cyclic alkyl group, a C$_{2-10}$ alkenyl group, a C$_{4-10}$ aryl group, and a C$_{4-10}$ heterocyclic group, with the proviso that R' and R" cannot both be hydrogen, wherein two or more of substituents R$^{1-8}$, R', and R" may be linked to form a substituted or unsubstituted, saturated or unsaturated, cyclic group, and wherein at least one of R$^{6-8}$ must be hydrogen, and at least two of R$^{6-8}$ must not be methyl; purging the reactor with a purge gas; introducing an oxygen-containing or nitrogen-containing source (or combination thereof) into the reactor; and purging the reactor with the purge gas, wherein the steps are repeated until a desired thickness of film is deposited; and wherein the method is conducted at one or more temperatures ranging from about 25° C. to 600° C.

In some embodiments, the oxygen-containing source employed in the method is a source selected from the group consisting of an oxygen plasma, ozone, a water vapor, water vapor plasma, nitrogen oxide (e.g., N$_2$O, NO, NO$_2$) plasma with or without inert gas, a carbon oxide (e.g., CO$_2$, CO) plasma and combinations thereof. In certain embodiments, the oxygen source further comprises an inert gas. In these embodiments, the inert gas is selected from the group consisting of argon, helium, nitrogen, hydrogen, and combinations thereof. In an alternative embodiment, the oxygen source does not comprise an inert gas. In yet another embodiment, the oxygen-containing source comprises nitrogen which reacts with the reagents under plasma conditions to provide a silicon oxynitride film.

In some embodiments, the nitrogen-containing source may be introduced into the reactor in the form of at least one nitrogen-containing source and/or may be present incidentally in the other precursors used in the deposition process. Suitable nitrogen source gases may include, for example, ammonia, hydrazine, monoalkylhydrazine, dialkylhydrazine, nitrogen, nitrogen/hydrogen, nitrogen/argon plasma, nitrogen/helium plasma, ammonia plasma, nitrogen plasma, nitrogen/hydrogen plasma, organic amines such as tert-butylamine, dimethylamine, diethylamine, isopropylamine, diethylamine plasma, dimethylamine plasma, trimethyl plasma, trimethylamine plasma, ethylenediamine plasma, and an alkoxyamine such as ethanolamine plasma and mixture thereof. In certain embodiments, the nitrogen-containing source comprises an ammonia plasma, a plasma comprising nitrogen and argon, a plasma comprising nitrogen and helium or a plasma comprising hydrogen and nitrogen source gas.

In the embodiments described above and throughout this invention, the inert gas is selected from the group consisting of argon, helium, nitrogen, hydrogen, or combinations thereof. In an alternative embodiment, the oxygen-containing plasma source does not comprise an inert gas.

One embodiment of the invention relates to uniform and conformal silicon-containing films such as silicon oxide having at least one or more of the following attributes: a density of about 2.1 g/cc or greater, a growth rate of 2.0 Å/cycle or greater, low chemical impurity, and/or high conformality in a thermal atomic layer deposition, a plasma enhanced atomic layer deposition (ALD) process or a plasma enhanced ALD-like process using cheaper, reactive, and more stable silicon precursor compounds.

The embodiments of the invention can be used alone or in combinations with each other.

DETAILED DESCRIPTION OF THE INVENTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein are illustrative and shall not limit the scope of the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

Described herein are methods related to the formation of a stoichiometric or nonstoichiometric film or material comprising silicon such as, without limitation, a silicon oxide, a carbon-doped silicon oxide film, a silicon oxynitride, a silicon nitride, a carbon-doped silicon nitride, a carbon-doped silicon oxynitride film or combinations thereof with one or more temperatures, of about 600° C. or less, or from about 25° C. to about 600° C. and, in some embodiments, from 25° C. to about 300° C. The films described herein are deposited in a deposition process such as an atomic layer deposition (ALD) or in an ALD-like process such as, without limitation, a plasma enhanced ALD (PEALD) or a plasma enhanced cyclic chemical vapor deposition process (PECCVD), a flowable chemical vapor deposition (FCVD), or a plasma enhanced flowable chemical vapor deposition (PEFCVD). The low temperature deposition (e.g., one or more deposition temperatures ranging from about ambient temperature to 600° C.) methods described herein provide films or materials that exhibit at least one or more of the following advantages: a density of about 2.1 g/cc or greater, low chemical impurity, high conformality in a thermal atomic layer deposition, a plasma enhanced atomic layer deposition (ALD) process or a plasma enhanced ALD-like process, an ability to adjust carbon content in the resulting film; and/or films have an etching rate of 5 Angstroms per second (Å/sec) or less when measured in 0.5 wt % dilute HF. For carbon-doped silicon oxide films, greater than 1% carbon is desired to tune the etch rate to values below 2 Å/sec in 0.5 wt % dilute HF in addition to other characteristics such as, without limitation, a density of about 1.8 g/cc or greater or about 2.0 g/cc or greater.

The present invention can be practiced using equipment known in the art. For example, the inventive method can use a reactor that is conventional in the semiconductor manufacturing art.

In one embodiment, the silicon precursor composition described herein comprises at least one functionalized cyclosilazanes having the following Formulae A, B, C, D, or E:

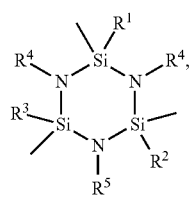

A

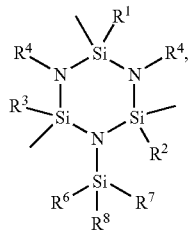

B

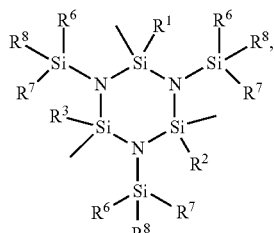

C

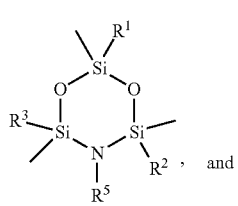

D, and

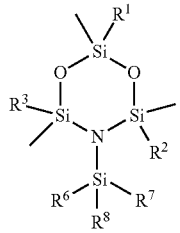

E wherein $R^{1-3}$ are each independently selected from the group consisting of hydrogen, methyl, and an organoamino group (NR'R"), wherein R' and R" are each independently selected from the group consisting of hydrogen, a $C_{1-10}$ linear alkyl group, a $C_{3-10}$ branched alkyl group, a $C_{3-10}$ cyclic alkyl group, a $C_{2-10}$ alkenyl group, a $C_{4-10}$ aryl group, and a $C_{4-10}$ heterocyclic group, with the proviso that R' and R" cannot both be hydrogen; $R^4$ and $R^5$ are each independently selected from the group consisting of hydrogen, a $C_{1-10}$ linear alkyl group, a $C_{3-10}$ branched alkyl group, a $C_{3-10}$ cyclic alkyl group, a $C_{2-10}$ alkenyl group, a $C_{4-10}$ aryl group, and a $C_{4-10}$ heterocyclic group; $R^{6-8}$ are each independently selected from the group consisting of hydrogen, methyl, an organoamino group (NR'R") as defined above, a $C_{3-10}$ branched alkyl group, a $C_{3-10}$ cyclic alkyl group, a $C_{2-10}$ alkenyl group, a $C_{4-10}$ aryl group, and a $C_{4-10}$ heterocyclic group, with the proviso that R' and R" cannot both be hydrogen, wherein two or more of substituents $R^{1-8}$, R', and R" may be linked to form a substituted or unsubstituted, saturated or unsaturated, cyclic group, and wherein at least one of $R^{6-8}$ must be hydrogen, and at least two of $R^{6-8}$ must not be methyl.

In certain embodiments of the composition described herein further comprises a solvent. Exemplary solvents can include, without limitation, ether, tertiary amine, alkyl hydrocarbon, aromatic hydrocarbon, tertiary aminoether, and combinations thereof. In certain embodiments, the difference between the boiling point of the silicon precursor and the boiling point of the solvent is 40° C. or less.

In the formulae above and throughout the description, the term "alkyl" denotes a linear or branched functional group having from 1 to 10 carbon atoms. Exemplary linear alkyl groups include, but are not limited to, methyl, ethyl, propyl, butyl, pentyl, and hexyl groups. Exemplary branched alkyl groups include, but are not limited to, iso-propyl, iso-butyl, sec-butyl, tert-butyl, iso-pentyl, tert-pentyl, iso-hexyl, and neo-hexyl. In certain embodiments, the alkyl group may have one or more functional groups attached thereto such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In the formulae above and throughout the description, the term "cyclic alkyl" denotes a cyclic functional group having from 3 to 10 carbon atoms. Exemplary cyclic alkyl groups include, but are not limited to, cyclobutyl, cyclopentyl, cyclohexyl, and cyclooctyl groups.

In the formulae above and throughout the description, the term "alkenyl group" denotes a group which has one or more carbon-carbon double bonds and has from 2 to 10 or from 2 to 6 carbon atoms.

In the formulae described herein and throughout the description, the term "dialkylamino group or alkylamino group" denotes a group which has two alkyl groups bonded to a nitrogen atom or one alkyl bonded to a nitrogen atom and has from 1 to 10 or from 2 to 6 or from 2 to 4 carbon atoms. Example include but not limited to HNMe, HNBu$^t$, NMe$_2$, NMeEt, NEt$_2$, NPr$^i_2$.

In the formulae above and throughout the description, the term "aryl" denotes an aromatic cyclic functional group having from 4 to 10 carbon atoms, from 5 to 10 carbon atoms, or from 6 to 10 carbon atoms. Exemplary aryl groups include, but are not limited to, phenyl, benzyl, chlorobenzyl, tolyl, o-xylyl, 1,2,3-triazolyl, pyrrrolyl, and furanyl.

In the formulae above and throughout the description, the term "heterocyclic" means a non-aromatic saturated monocyclic or multicyclic ring system of about 3 to about 10 ring atoms, preferably about 5 to about 10 ring atoms, in which one or more of the atoms in the ring system is/are element(s) other than carbon, for example nitrogen, oxygen or sulfur. Preferred heterocycles contain about 5 to about 6 ring atoms. The prefix aza, oxa or thia before heterocycle means that at least a nitrogen, oxygen or sulfur atom respectively is present as a ring atom. The heterocyclic group is optionally substituted.

Exemplary functionalized cyclosilazane precursors are listed in Table 1:

TABLE 1

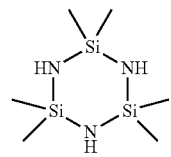

2,2,4,4,6,6-hexamethylcyclotrisilazane

TABLE 1-continued

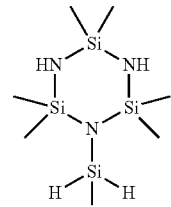

1-silyl-2,2,4,4,6,6-hexamethylcyclotrisilazane

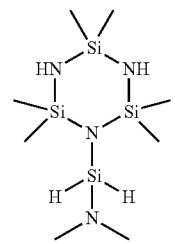

1-(dimethylaminosilyl)-2,2,4,4,6,6-hexamethylcyclotrisilazane

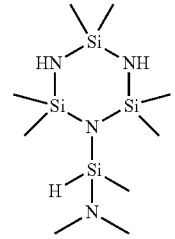

1-(dimethylamino-methylsilyl)-2,2,4,4,6,6-hexamethylcyclotrisilazane

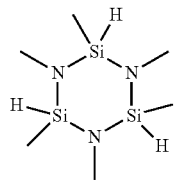

1,2,3,4,5,6-hexamethylcyclotrisilazane

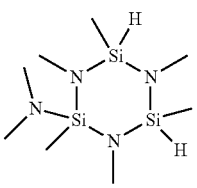

2-dimethylamino-1,2,3,4,5,6-hexamethylcyclotrisilazane

TABLE 1-continued

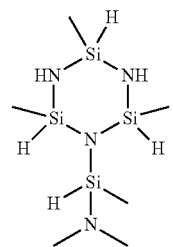

1-(dimethylamino-
methylsilyl)-2,4,6-
trimethylcyclotrisilazane

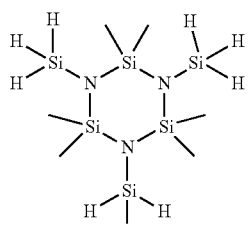

1,2,3-trisilyl-2,2,4,4,6,6-
hexamethylcyclotrisilazane

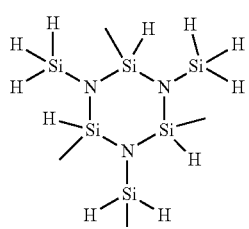

1,2,3-trisilyl-2,4,6-
trimethylcyclotrisilazane

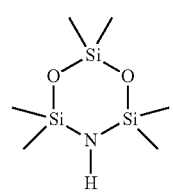

2,2,4,4,6,6-hexamethyl-1,3-
dioxa-5-aza-2,4,6-
trisilacyclohexane

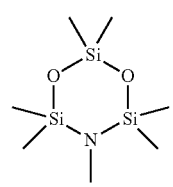

2,2,4,4,5,6,6-heptamethyl-1,
3-dioxa-5-aza-2,4,6-
trisilacyclohexane

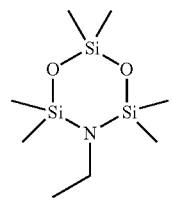

5-ethyl-2,2,4,4,6,6-
hexamethyl-1,3-dioxa-5-aza-
2,4,6-trisilacyclohexane

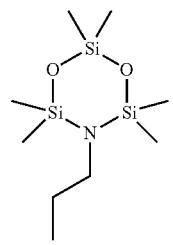

5-n-propyl-2,2,4,4,6,6-
hexamethyl-1,3-dioxa-5-aza-
2,4,6-trisilacyclohexane

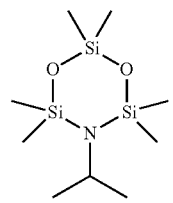

5-iso-propyl-2,2,4,4,6,6-
hexamethyl-1,3-dioxa-5-aza-
2,4,6-trisilacyclohexane

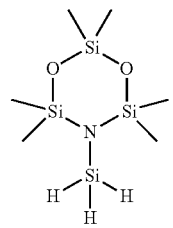

5-silyl-2,2,4,4,6,6-
hexamethyl-1,3-dioxa-5-aza-
2,4,6-trisilacyclohexane

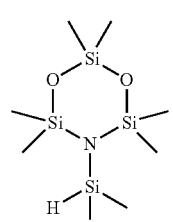

5-methylsilyl-2,2,4,4,6,6-
hexamethyl-1,3-dioxa-5-aza-
2,4,6-trisilacyclohexane

TABLE 1-continued

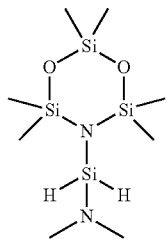

5-(dimethylaminosilyl)-2,2,4,
4,6,6-hexamethyl-1,3-dioxa-
5-aza-2,4,6-
trisilacyclohexane

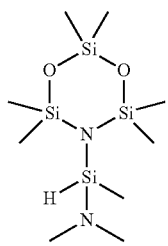

5-(dimethylamino-
methylsilyl)-2,2,4,4,6,6-
hexamethyl-1,3-dioxa-5-aza-
2,4,6-trisilacyclohexane In another embodiment of the present invention, a method is described herein for depositing a silicon-containing film on at least one surface of a substrate, wherein the method comprises the steps of:

a. providing a substrate in a reactor;
b. introducing into the reactor at least one silicon precursor having Formulae A to E as defined above;
c. purging the reactor with purge gas;
d. introducing oxygen-containing source comprising a plasma into the reactor; and
e. purging the reactor with a purge gas.

In this method, steps b through e are repeated until a desired thickness of film is deposited on the substrate.

The method of the present invention is conducted via an ALD process that uses ozone or an oxygen-containing source which comprises a plasma wherein the plasma can further comprise an inert gas such as one or more of the following: an oxygen plasma with or without inert gas, a water vapor plasma with or without inert gas, a nitrogen oxide (e.g., $N_2O$, NO, $NO_2$) plasma with or without inert gas, a carbon oxide (e.g., $CO_2$, CO) plasma with or without inert gas, and combinations thereof.

The oxygen-containing plasma source can be generated in situ or, alternatively, remotely. In one particular embodiment, the oxygen-containing source comprises oxygen and is flowing, or introduced during method steps b through d, along with other reagents such as without limitation, the at least one silicon precursor and optionally an inert gas.

In certain embodiments, the silicon precursor compounds having Formulae A to E according to the present invention and compositions comprising the silicon precursor compounds having Formulae A to E according to the present invention are preferably substantially free of halide ions. As used herein, the term "substantially free" as it relates to halide ions (or halides) such as, for example, chlorides and fluorides, bromides, and iodides, means less than 5 ppm (by weight), preferably less than 3 ppm, and more preferably less than 1 ppm, and most preferably 0 ppm as measured by ICP-MS. Chloride-containing impurities are known to act as decomposition catalysts for the silicon precursor compounds having Formulae A to E. In certain cases, significant levels of chloride in the final product can cause the silicon precursor compounds to degrade. The gradual degradation of the silicon precursor compounds may directly impact the film deposition process making it difficult for the semiconductor manufacturer to meet film specifications. In addition, the shelf-life or stability is negatively impacted by the higher degradation rate of the silicon precursor compounds thereby making it difficult to guarantee a 1-2 year shelf-life. Therefore, the accelerated decomposition of the silicon precursor compounds presents safety and performance concerns related to the formation of these flammable and/or pyrophoric gaseous byproducts.

For those embodiments wherein at least one silicon precursor(s) having Formulae A to E is (are) used in a composition comprising a solvent, the solvent or mixture thereof selected does not react with the silicon precursor. The amount of solvent by weight percentage in the composition ranges from 0.5 wt % by weight to 99.5 wt % or from 10 wt % by weight to 75 wt %. In this or other embodiments, the solvent has a boiling point (b.p.) similar to the b.p. of the silicon precursor of Formulae A to E or the difference between the b.p. of the solvent and the b.p. of the silicon precursor of Formulae A to E is 40° C. or less, 30° C. or less, or 20° C. or less, or 10° C. Alternatively, the difference between the boiling points ranges from any one or more of the following end-points: 0, 10, 20, 30, or 40° C. Examples of suitable ranges of b.p. difference include without limitation, 0 to 40° C., 20° to 30° C., or 10° to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkyl hydrocarbon (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

Throughout the description, the term "ALD or ALD-like" refers to a process including, but not limited to, the following processes: a) each reactant including a silicon precursor and a reactive gas is introduced sequentially into a reactor such as a single wafer ALD reactor, semi-batch ALD reactor, or batch furnace ALD reactor; b) each reactant including the silicon precursor and the reactive gas is exposed to a substrate by moving or rotating the substrate to different sections of the reactor and each section is separated by inert gas curtain, i.e., spatial ALD reactor or roll to roll ALD reactor.

In certain embodiments, silicon oxide or carbon doped silicon oxide films deposited using the methods described herein are formed in the presence of oxygen-containing source comprising ozone, water ($H_2O$) (e.g., deionized water, purifier water, and/or distilled water), oxygen ($O_2$), oxygen plasma, NO, $N_2O$, $NO_2$, carbon monoxide (CO), carbon dioxide ($CO_2$) and combinations thereof. The oxygen-containing source is passed through, for example, either an in situ or remote plasma generator to provide oxygen-containing plasma source comprising oxygen such as an oxygen plasma, a plasma comprising oxygen and argon, a plasma comprising oxygen and helium, an ozone plasma, a water plasma, a nitrous oxide plasma, or a carbon dioxide plasma. In certain embodiments, the oxygen-containing plasma source comprises an oxygen source gas that is introduced into the reactor at a flow rate ranging from about 1 to about 2000 standard cubic centimeters (sccm) or from about 1 to about 1000 sccm. The oxygen-containing plasma source can be introduced for a time that ranges from about 0.1 to about 100 seconds. In one particular embodiment, the oxygen-containing plasma source comprises water having a temperature of 10° C. or greater. In embodiments wherein the film is deposited by a PEALD or a plasma enhanced cyclic CVD process, the precursor pulse can have a pulse duration that is greater than 0.01 seconds (e.g., about 0.01 to about 0.1 seconds, about 0.1 to about 0.5 seconds, about 0.5 to about 10 seconds, about 0.5 to about 20 seconds, about 1 to about 100 seconds) depending on the ALD reactor's volume, and the oxygen-containing plasma source can have a pulse duration that is less than 0.01 seconds (e.g., about 0.001 to about 0.01 seconds).

The deposition methods disclosed herein may involve one or more purge gases. The purge gas, which is used to purge away unconsumed reactants and/or reaction byproducts, is an inert gas that does not react with the precursors, and thereby forming a composition comprising the foregoing. Exemplary purge gases include, but are not limited to, argon (Ar), nitrogen ($N_2$), helium (He), neon, hydrogen ($H_2$), and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

The respective step of supplying the precursors, oxygen source, and/or other precursors, source gases, and/or reagents may be performed by changing the time for supplying them to change the stoichiometric composition of the resulting dielectric film.

Energy is applied to the at least one of the silicon precursors of Formulae A to E, oxygen containing source, or combination thereof to induce reaction and to form the dielectric film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated outside of the reactor and supplied into the reactor.

The at least one silicon precursor may be delivered to the reaction chamber such as a plasma enhanced cyclic CVD or PEALD reactor or a batch furnace type reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

As previously mentioned, the purity level of the at least one silicon precursor is sufficiently high enough to be acceptable for reliable semiconductor manufacturing. In certain embodiments, the at least one silicon precursor described herein comprise less than 2% by weight, or less than 1% by weight, or less than 0.5% by weight of one or more of the following impurities: free amines, free halides or halogen ions, and higher molecular weight species. Higher purity levels of the silicon precursor described herein can be obtained through one or more of the following processes: purification, adsorption, and/or distillation.

In one embodiment of the method described herein, a plasma enhanced cyclic deposition process such as PEALD-like or PEALD may be used wherein the deposition is conducted using the at least one silicon precursor and an oxygen plasma source. The PEALD-like process is defined as a plasma enhanced cyclic CVD process but still provides high conformal silicon and oxygen-containing films.

In certain embodiments, the gas lines connecting from the precursor canisters to the reaction chamber are heated to one or more temperatures depending upon the process requirements and the container of the at least one silicon precursor is kept at one or more temperatures for bubbling. In other embodiments, a solution comprising the at least one silicon precursor is injected into a vaporizer kept at one or more temperatures for direct liquid injection.

A flow of argon and/or other gas may be employed as a carrier gas to help deliver the vapor of the at least one silicon precursor to the reaction chamber during the precursor pulsing. In certain embodiments, the reaction chamber process pressure is about 50 mTorr to 10 Torr. In other embodiments, the reaction chamber process pressure can be up to 760 Torr (e.g., about 50 mtorr to about 100 Torr).

In a typical PEALD or a PEALD-like process such as a PECCVD process, the substrate such as a silicon oxide substrate is heated on a heater stage in a reaction chamber that is exposed to the silicon precursor initially to allow the complex to chemically adsorb onto the surface of the substrate.

A purge gas such as argon purges away unabsorbed excess complex from the process chamber. After sufficient purging, an oxygen source may be introduced into reaction chamber to react with the absorbed surface followed by another gas purge to remove reaction by-products from the chamber. The process cycle can be repeated to achieve the desired film thickness. In some cases, pumping can replace a purge with inert gas or both can be employed to remove unreacted silicon precursors.

In this or other embodiments, it is understood that the steps of the methods described herein may be performed in a variety of orders, may be performed sequentially, may be performed concurrently (e.g., during at least a portion of another step), and any combination thereof. The respective step of supplying the precursors and the oxygen source gases, for example, may be performed by varying the duration of the time for supplying them to change the stoichiometric composition of the resulting dielectric film. Also, purge times after precursor or oxidant steps can be minimized to <0.1 s so that throughput is improved.

In one particular embodiment, the method described herein deposits a high quality silicon-containing film such as, for example, a silicon and oxygen-containing film, on a substrate. The method comprises the following steps:
a. providing a substrate in a reactor;
b. introducing into the reactor at least one silicon precursor having the Formulae A to E described herein;

c. purging reactor with purge gas to remove at least a portion of the unabsorbed precursors;
d. introducing an oxygen-containing plasma source into the reactor and
e. purging reactor with purge gas to remove at least a portion of the unreacted oxygen source, wherein steps b through e are repeated until a desired thickness of the silicon-containing film is deposited.

Another method disclosed herein forms a carbon doped silicon oxide film using a silicon precursor compound having the chemical structure represented by Formulae A to E as defined above plus an oxygen source.

Another exemplary process is described as follows:
a. providing a substrate in a reactor;
b. contacting vapors generated from at least one silicon precursor compound having a structure represented by Formulae A to E as defined above, with or without co-flowing an oxygen source to chemically absorb the precursors on the heated substrate;
c. purging away any unabsorbed precursors;
d. Introducing an oxygen source on the heated substrate to react with the absorbed precursors; and,
e. purging away any unreacted oxygen source, wherein steps b through e are repeated until a desired thickness is achieved.

In another particular embodiment, the method described herein deposits a high quality silicon-containing film such as, for example, a silicon nitride film, on a substrate. The method comprises the following steps:
a. providing a substrate in a reactor;
b. introducing into the reactor at least one silicon precursor having the Formulae A to E described herein;
c. purging reactor with purge gas to remove at least a portion of the unabsorbed precursors;
d. introducing an nitrogen-containing plasma source into the reactor and
e. purging reactor with purge gas to remove at least a portion of the unreacted nitrogen source, wherein steps b through e are repeated until a desired thickness of the silicon-containing film is deposited.

Another exemplary process is described as follows:
a. providing a substrate in a reactor;
b. contacting vapors generated from at least one silicon precursor compound having a structure represented by Formulae A to E as defined above, with or without co-flowing a nitrogen source to chemically absorb the precursors on the heated substrate;
c. purging away any unabsorbed precursors;
d. Introducing a nitrogen source on the heated substrate to react with the absorbed precursors; and,
e. purging away any unreacted nitrogen source, wherein steps b through e are repeated until a desired thickness is achieved.

Various commercial ALD reactors such as single wafer, semi-batch, batch furnace or roll to roll reactor can be employed for depositing the solid silicon oxide, silicon nitride, silicon oxynitride, carbon doped silicon nitride, carbon doped silicon oxynitride, or carbon doped silicon oxide.

Process temperature for the method described herein use one or more of the following temperatures as endpoints: 0, 25, 50, 75, 100, 125, 150, 175, 200, 225, 250, 275, 300° C., 325° C., 350° C., 375° C., 400° C., 425° C., 450° C., 500° C., 525° C., 550° C. Exemplary temperature ranges include, but are not limited to the following: from about 0° C. to about 300° C.; or from about 25° C. to about 300° C.; or from about 50° C. to about 290° C.; or from about 25° C. to about 250° C., or from about 25° C. to about 200° C.

In another aspect, there is provided a method for depositing a silicon-containing film via flowable chemical vapor deposition (FCVD), the method comprising:
placing a substrate comprising a surface feature into a reactor wherein the substrate is maintained at one or more temperatures ranging from about −20° C. to about 400° C. and a pressure of the reactor is maintained at 100 torr or less;
introducing at least one compound selected from the group consisting of Formulae A to E:
providing an oxygen source into the reactor to react with the at least one compound to form a film and cover at least a portion of the surface feature;
annealing the film at one or more temperatures of about 100° C. to 1000° C. to coat at least a portion of the surface feature; and
treating the substrate with an oxygen source at one or more temperatures ranging from about 20° C. to about 1000° C. to form the silicon-containing film on at least a portion of the surface feature.

In another aspect, there is provided a method for depositing a silicon-containing film via flowable chemical vapor deposition (FCVD), the method comprising:
placing a substrate comprising a surface feature into a reactor wherein the substrate is maintained at one or more temperatures ranging from about −20° C. to about 400° C. and a pressure of the reactor is maintained at 100 torr or less;
introducing at least one compound selected from the group consisting of Formulae A to E:
providing a nitrogen source into the reactor to react with the at least one compound to form a film and cover at least a portion of the surface feature;
annealing the film at one or more temperatures of about 100° C. to 1000° C. to coat at least a portion of the surface feature; and
treating the substrate with an oxygen source at one or more temperatures ranging from about 20° C. to about 1000° C. to form the silicon-containing film on at least a portion of the surface feature.

In certain embodiments, the oxygen source is selected from the group consisting of water vapors, water plasma, ozone, oxygen, oxygen plasma, oxygen/helium plasma, oxygen/argon plasma, nitrogen oxides plasma, carbon dioxide plasma, hydrogen peroxide, organic peroxides, and mixtures thereof. In other embodiments, the nitrogen source is selected from the group consisting of for example, ammonia, hydrazine, monoalkylhydrazine, dialkylhydrazine, nitrogen, nitrogen/hydrogen, nitrogen/argon plasma, nitrogen/helium plasma, ammonia plasma, nitrogen plasma, nitrogen/hydrogen plasma, organic amines such as tert-butylamine, dimethylamine, diethylamine, isopropylamine, diethylamine plasma, dimethylamine plasma, trimethyl plasma, trimethylamine plasma, ethylenediamine plasma, and an alkoxyamine such as ethanolamine plasma, and mixtures thereof. In yet other embodiments, the nitrogen-containing source comprises an ammonia plasma, a plasma comprising nitrogen and argon, a plasma comprising nitrogen and helium or a plasma comprising hydrogen and nitrogen source gas. In this or other embodiments, the method steps are repeated until the surface features are filled with the silicon-containing film. In embodiments wherein water vapor is employed as an oxygen source, the substrate temperature ranges from about −20° C. to about 40° C. or from about −10° C. to about 25° C.

In a still further embodiment of the method described herein, the film or the as-deposited film deposited from ALD, ALD-like, PEALD, PEALD-like or FCVD is subjected to a treatment step (post deposition). The treatment step can be conducted during at least a portion of the deposition step, after the deposition step, and combinations thereof. Exemplary treatment steps include, without limitation, treatment via high temperature thermal annealing; plasma treatment; ultraviolet (UV) light treatment; laser; electron beam treatment and combinations thereof to affect one or more properties of the film.

The films deposited with the silicon precursors having Formulae A to E described herein, when compared to films deposited with previously disclosed silicon precursors under the same conditions, have improved properties such as, without limitation, a wet etch rate that is lower than the wet etch rate of the film before the treatment step or a density that is higher than the density prior to the treatment step. In one particular embodiment, during the deposition process, as-deposited films are intermittently treated. These intermittent or mid-deposition treatments can be performed, for example, after each ALD cycle, after every a certain number of ALD, such as, without limitation, one (1) ALD cycle, two (2) ALD cycles, five (5) ALD cycles, or after every ten (10) or more ALD cycles.

The precursors of Formulae A to E exhibit a growth rate of 1.0 Å/cycle or greater, preferably a growth rate of 1.5 Å/cycle or greater, most preferable a growth rate of 2.0 Å/cycle or greater.

In an embodiment wherein the film is treated with a high temperature annealing step, the annealing temperature is at least 100° C. or greater than the deposition temperature. In this or other embodiments, the annealing temperature ranges from about 400° C. to about 1000° C. In this or other embodiments, the annealing treatment can be conducted in a vacuum (<760 Torr), inert environment or in oxygen containing environment (such as $H_2O$, $N_2O$, $NO_2$ or $O_2$).

In an embodiment wherein the film is treated to UV treatment, film is exposed to broad band UV or, alternatively, an UV source having a wavelength ranging from about 150 nanometers (nm) to about 400 nm. In one particular embodiment, the as-deposited film is exposed to UV in a different chamber than the deposition chamber after a desired film thickness is reached.

In an embodiment where in the film is treated with a plasma, passivation layer such as $SiO_2$ or carbon doped $SiO_2$ is deposited to prevent chlorine and nitrogen contamination to penetrate into film in the subsequent plasma treatment. The passivation layer can be deposited using atomic layer deposition or cyclic chemical vapor deposition.

In an embodiment wherein the film is treated with a plasma, the plasma source is selected from the group consisting of hydrogen plasma, plasma comprising hydrogen and helium, plasma comprising hydrogen and argon. Hydrogen plasma lowers film dielectric constant and boost the damage resistance to following plasma ashing process while still keeping the carbon content in the bulk almost unchanged.

Without intending to be bound by a particular theory, it is believed that the silicon precursor compound having a chemical structure represented by Formulae A to E as defined above can be anchored via breaking an Si—N bond, organoaminosilyl group, or silazane group with hydroxyl on substrate surface to provide Si—O—Si' fragments wherein the Si' fragment is bonded to a nitrogen atom that is part of the 6-membered ring which comprises at least two additional silicon atoms, thus increasing the growth rate of silicon oxide or carbon doped silicon oxide compared to conventional silicon precursors such as bis(tert-butylamino) silane or bis(diethylamino)silane having only one silicon atom. With the functionalized cyclosilazanes having Formulae A to E, as many as 3 to 6 silicon atoms can be anchored to the substrate per molecule during a silicon precursor pulse step.

In certain embodiments, the silicon precursors having Formulae A to E as defined above can also be used as a dopant for metal containing films, such as but not limited to, metal oxide films or metal nitride films. In these embodiments, the metal containing film is deposited using an ALD or CVD process such as those processes described herein using metal alkoxide, metal amide, or volatile organometallic precursors. Examples of suitable metal alkoxide precursors that may be used with the method disclosed herein include, but are not limited to, group 3 to 6 metal alkoxide, group 3 to 6 metal complexes having both alkoxy and alkyl substituted cyclopentadienyl ligands, group 3 to 6 metal complexes having both alkoxy and alkyl substituted pyrrolyl ligands, group 3 to 6 metal complexes having both alkoxy and diketonate ligands; group 3 to 6 metal complexes having both alkoxy and ketoester ligands.

Examples of suitable metal amide precursors that may be used with the method disclosed herein include, but are not limited to, tetrakis(dimethylamino)zirconium (TDMAZ), tetrakis(diethylamino)zirconium (TDEAZ), tetrakis(ethylmethylamino)zirconium (TEMAZ), tetrakis(dimethylamino)hafnium (TDMAH), tetrakis(diethylamino)hafnium (TDEAH), and tetrakis(ethylmethylamino)hafnium (TEMAH), tetrakis(dimethylamino)titanium (TDMAT), tetrakis(diethylamino)titanium (TDEAT), tetrakis(ethylmethylamino)titanium (TEMAT), tert-butylimino tri(diethylamino)tantalum (TBTDET), tert-butylimino tri(dimethylamino)tantalum (TBTDMT), tert-butylimino tri(ethylmethylamino)tantalum (TBTEMT), ethylimino tri(diethylamino)tantalum (EITDET), ethylimino tri(dimethylamino)tantalum (EITDMT), ethylimino tri(ethylmethylamino)tantalum (EITEMT), tert-amylimino tri(dimethylamino)tantalum (TAIMAT), tert-amylimino tri(diethylamino)tantalum, pentakis(dimethylamino)tantalum, tert-amylimino tri(ethylmethylamino)tantalum, bis(tert-butylimino)bis(dimethylamino)tungsten (BTBMW), bis(tert-butylimino)bis(diethylamino)tungsten, bis(tert-butylimino)bis(ethylmethylamino)tungsten, and combinations thereof. Examples of suitable organometallic precursors that may be used with the method disclosed herein include, but are not limited to, group 3 metal cyclopentadienyls or alkyl cyclopentadienyls. Exemplary Group 3 to 6 metals herein include, but not limited to, Y, La, Ce, Pr, Nd, Sm, Eu, Gd, Tb, Dy, Er, Yb, Lu, Ti, Hf, Zr, V, Nb, Ta, Cr, Mo, and W.

In certain embodiments, the silicon-containing films described herein have a dielectric constant of 6 or less, 5 or less, 4 or less, and 3 or less. In these or other embodiments, the films can a dielectric constant of about 5 or below, or about 4 or below, or about 3.5 or below. However, it is envisioned that films having other dielectric constants (e.g., higher or lower) can be formed depending upon the desired end-use of the film. An example of silicon-containing film that is formed using the silicon precursors having Formulae A to E precursors and processes described herein has the formulation $Si_xO_yC_zN_vH_w$ wherein Si ranges from about 10% to about 40%; O ranges from about 0% to about 65%; C ranges from about 0% to about 75% or from about 0% to about 50%; N ranges from about 0% to about 75% or from about 0% to 50%; and H ranges from about 0% to about 50% atomic percent weight % wherein x+y+z+v+w=100 atomic weight percent, as determined for example, by XPS or other means. Another example of the silicon containing film that is formed using the silicon precursors of Formulae A to E and processes described herein is silicon carbonitride wherein the carbon content is from 1 at % to 80 at % measured by XPS. In yet, another example of the silicon containing film that is formed using the silicon precursors having Formulae A to E and processes described herein is amorphous silicon wherein both sum of nitrogen and carbon contents is <10 at %, preferably <5 at %, most preferably <1 at % measured by XPS.

As mentioned previously, the method described herein may be used to deposit a silicon-containing film on at least a portion of a substrate. Examples of suitable substrates include but are not limited to, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, germanium, germanium-containing, boron-containing, Ga/As, a flexible substrate, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The deposited films have applications, which include, but are not limited to, computer chips, optical devices, magnetic information storages, coatings on a supporting material or substrate, microelectromechanical systems (MEMS), nano-electromechanical systems, thin film transistor (TFT), light emitting diodes (LED), organic light emitting diodes (OLED), IGZO, and liquid crystal displays (LCD). Potential use of resulting solid silicon oxide or carbon doped silicon oxide include, but not limited to, shallow trench insulation, inter layer dielectric, passivation layer, an etch stop layer, part of a dual spacer, and sacrificial layer for patterning.

The methods described herein provide a high quality silicon oxide, silicon nitride, silicon oxynitride, carbon doped silicon nitride, carbon doped silicon oxynitride, or carbon-doped silicon oxide film. The term "high quality" means a film that exhibits one or more of the following characteristics: a density of about 2.1 g/cc or greater, 2.2 g/cc or greater, 2.25 g/cc or greater; a wet etch rate that is 2.5 Å/s or less, 2.0 Å/s or less, 1.5 Å/s or less, 1.0 Å/s or less, 0.5 Å/s or less, 0.1 Å/s or less, 0.05 Å/s or less, 0.01 Å/s or less as measured in a solution of 1:100 of HF to water dilute HF (0.5 wt % dHF) acid, an electrical leakage of about 1 or less e-8 $A/cm^2$ up to 6 MV/cm); a hydrogen impurity of about 5 e20 at/cc or less as measured by SIMS; and combinations thereof. With regard to the etch rate, a thermally grown silicon oxide film has 0.5 Å/s etch rate in 0.5 wt % Hf.

In certain embodiments, one or more silicon precursors having Formulae A to E described herein can be used to form silicon and oxygen containing films that are solid and are non-porous or are substantially free of pores.

The following examples illustrate the method for depositing silicon oxide films described herein and are not intended to limit the appended claims.

EXAMPLES

Thermal Atomic Layer Deposition of silicon oxide films were performed on a laboratory scale ALD processing tool. The silicon precursor was delivered to the chamber by vapor draw. All gases (e.g., purge and reactant gas or precursor and oxygen source) were preheated to 100° C. prior to entering the deposition zone. Gases and precursor flow rates were controlled with ALD diaphragm valves with high speed actuation. The substrates used in the deposition were 12-inch-long silicon strips. A thermocouple is attached on the sample holder to confirm substrate temperature. Depositions were performed using ozone as oxygen source gas. Normal deposition process and parameters are shown in Table 2.

TABLE 2

Process for Thermal Atomic Layer Deposition of Silicon Oxide Films with Ozone as Oxygen Source on the Laboratory Scale ALD Processing Tool.

| Step 1 | 6 sec | Evacuate reactor | <100 mT |
|---|---|---|---|
| Step 2 | variable | Dose Silicon precursor | Reactor pressure typically <2 Torr |
| Step 3 | 6 sec | Purge reactor with nitrogen | Flow 1.5 slpm $N_2$ |
| Step 4 | 6 sec | Evacuate reactor | <100 mT |
| Step 5 | variable | Dose oxygen source ozone | |
| Step 6 | 6 sec | Purge reactor with nitrogen | Flow 1.5 slpm $N_2$ |

Plasma enhanced ALD (PEALD) was performed on a commercial lateral flow reactor (300 mm PEALD tool manufactured by ASM) equipped with 27.1 MHz direct plasma capability with 3.5 mm fixed spacing between electrodes. The laminar flow chamber design utilizes outer and inner chambers which have independent pressure settings. The inner chamber is the deposition reactor in which all reactant gases (e.g. precursor, argon) were mixed in the manifold and delivered to the process reactor. Argon gas was used to maintain reactor pressure in the outer chamber. Precursors were liquids maintained in stainless steel bubblers and delivered to the chamber with Ar carrier gas (typically set at 200 sccm flow). All depositions reported in this study were done on native oxide containing Si substrates of 8-12 Ohm-cm. Thickness and refractive indices of the films were measured using a FilmTek 2000SE ellipsometer. The growth rate per cycle (GPC) is calculated by dividing the measured thickness of resulting silicon oxide film by the number of total ALD/PEALD cycles.

Example 1. Synthesis of 1-(dimethylaminomethylsilyl)-2,2,4,4,6,6-hexamethylcyclotrisilazane (prophetic)

1-methylsilyl-2,2,4,4,6,6-hexamethylcyclotrisilazane is combined with dimethylamine in THF solvent in a round-bottom flask. While stirring, 1 mol % $Ru_3(CO)_{12}$ catalyst is added. The reaction mixture is stirred for 1 day at room temperature while allowing the $H_2$ gas byproduct to vent. The reaction mixture is purified by vacuum-distillation to provide 1-(dimethylaminomethylsilyl)-2,2,4,4,6,6-hexamethylcyclotrisilazane.

Example 2. Synthesis of 2-dimethylamino-1,2,3,4,5,6-hexamethylcyclotrisilazane

To a mixture of 1,2,3,4,5,6-hexamethylcyclotrisilazane (200 g, 0.91 mmol) and $Ru_3(CO)_{12}$ catalyst (1.45 g, 0.00227 mol) stirring in a 1 liter round bottom flask was added dimethylamine (230 mL of 2.0 M solution in THF, 0.46 mol) in 3 separate portions over the course of 6 hours. The reaction mixture was stirred for 1 day at room temperature while allowing the $H_2$ gas byproduct to vent. The volatiles were vacuum-transferred in a flask-to-flask apparatus with the receiver flask chilled to −78° C. The condensed volatiles were purified by vacuum-distillation to provide 2-dimethylamino-1,2,3,4,5,6-hexamethylcyclotrisilazane. GC-MS showed the following peaks: 262 (M+), 247 (M-15), 231, 218, 202, 189, 175, 159, 145, 131, 118, 102, 88, 72.

Example 3. Synthesis of 1,2,3-trisilyl-2,2,4,4,6,6-hexamethylcyclotrisilazane (prophetic)

2,2,4,4,6,6-hexamethylcyclotrisilazane is combined with 3 equivalents of triethylamine in hexanes solvent and chilled to −50° C. 3 equivalents of monochlorosilane is then condensed slowly into the reaction vessel while stirring at −50° C. The resulting slurry is allowed to warm slowly to room temperature while stirring. The solids are removed via filtration and the solvent and other low-boilers are removed under reduced pressure. The crude product is purified via vacuum-distillation to provide 1,2,3-trisilyl-2,2,4,4,6,6-hexamethylcyclotrisilazane.

Example 4. Synthesis of 2,2,4,4,5,6,6-heptamethyl-1,3-dioxa-5-aza-2,4,6-trisilacyclohexane (Prophetic)

1,1,1,2,3,3,3-heptamethyldisilazane is combined with 1 equivalent of 1,5-dichloro-1,1,3,3,5,5-hexamethyltrisiloxane in the presence of catalytic amount of pyridine. After the reaction is determined to be complete by GC analysis, the crude reaction mixture is purified by vacuum distillation to provide 2,2,4,4,5,6,6-heptamethyl-1,3-dioxa-5-aza-2,4,6-trisilacyclohexane.

Example 5. Synthesis of 5-(dimethylaminosilyl)-2,2,4,4,6,6-hexamethyl-1,3-dioxa-5-aza-2,4, 6-trisilacyclohexane (Prophetic)

Dimethylamine is added as a 2.0 M solution in THF to a stirred mixture of 5-silyl-2, 2,4,4,6,6-hexamethyl-1,3-dioxa-5-aza-2,4,6-trisilacyclohexane and 0.1 mol % $Ru_3(CO)_{12}$ catalyst. The mixture is allowed to stir for 1 day at room temperature, allowing for the $H_2$ gas byproduct to vent. The reaction mixture is purified by vacuum-distillation to provide 5-(dimethylaminosilyl)-2,2,4,4,6,6-hexamethyl-1,3-dioxa-5-aza-2,4,6-trisilacyclohexane.

Example 6. Synthesis of 5-iso-propyl-2,2,4,4,6,6-hexamethyl-1,3-dioxa-5-aza-2,4,6-trisilacyclohexane A solution of 1,5-dichloro-1,1,3,3,5,5-hexamethyltrisiloxane (0.5 g, 0.0018 mol) in pentane (5 mL) is added dropwise to a stirred solution of iso-propylamine (0.40 g, 0.0068 mol) in pentane (4 mL). The resulting white slurry was allowed to stir overnight. The solids were removed by filtration and the resulting filtrate was determined by GC-MS analysis to contain 5-iso-propyl-2,2,4,4,6,6-hexamethyl-1,3-dioxa-5-aza-2,4,6-trisilacyclohexane as one of the products. GC-MS showed the following peaks: 262 (M+), 248, 234, 218, 207, 193, 177, 160, 147, 133, 119, 110, 96, 88, 73.

Example 7. Synthesis of 5-n-propyl-2,2,4,4,6,6-hexamethyl-1,3-dioxa-5-aza-2,4,6-trisilacyclohexane A solution of n-propylamine (0.30 g, 0.0051 mol) in hexanes (4 mL) was added dropwise to a stirred mixture of, 5-dichloro-1,1,3,3,5,5-hexamethyltrisiloxane (0.5 g, 0.0018 mol) and triethylamine (0.40, 0.0020 mol) in hexanes (4 mL). The resulting slurry was stirred overnight. The solids were removed by filtration and the resulting filtrate was determined by GC-MS to contain 5-n-propyl-2,2,4,4,6,6-hexamethyl-1,3-dioxa-5-aza-2,4,6-trisilacyclohexane as one of the products. GC-MS showed the following peaks: 262 (M+), 248, 234, 218, 207, 193, 177, 160, 147, 133, 119, 110, 96, 88, 73.

Example 8. Synthesis of 1-(di-iso-propylaminosilyl)-2,2,4,4,6,6-hexamethylcyclotrisilazane Under the protection of nitrogen atmosphere, 116 mL of butyllithium solution (2.5 M in hexanes, 0.29 mol) was added dropwise to a stirred solution of 2,2,4,4,6,6-hexamethylcyclotrisilazane (66 g, 0.30 mol) in hexanes (140 mL) at −30° C. After the addition is complete, the reaction was allowed to warm to room temperature and stir for 2 hours. The resulting reaction mixture was then chilled to −30° C. To this mixture was added (di-iso-propylamino)chlorosilane (48 g, 0.29 mol) dropwise via addition funnel at −30° C. The reaction mixture was allowed to warm to room temperature while stirring. The white solids were removed via filtration and the solvent removed under reduced pressure. The crude product was purified by vacuum-distillation to provide the desired product, 1-(di-iso-propylaminosilyl)-2,2,4,4,6,6-hexamethylcyclotrisilazane. GC-MS showed the following peaks: 349 (M+), 334 (M-15), 318, 306, 292, 276, 248, 234, 218, 203, 188, 175, 159, 142, 130, 116, 100, 86, 73.

Examples 9-11: Synthesis of Additional Functionalized Cyclosilazane Precursor Compounds Additional functionalized cyclosilazane precursor compounds were made via similar fashion as Example 8 and were characterized by GC-MS. The molecular weight (MW), the structure, and corresponding major MS fragmentation peaks of each compound are provided in Table 3 to confirm their identification.

TABLE 3

| Ex. | Precursor Name | MW | Structure | MS Peaks |
|---|---|---|---|---|
| 9 | 1-(dimethylaminosilyl)-2,2,4,4,6,6-hexamethylcyclotrisilazane | 292.68 | (structure) | 291, 277, 261, 248, 234, 218, 203, 189, 174, 160, 143, 131, 116, 100, 86, 73 |

TABLE 3-continued

| Ex. | Precursor Name | MW | Structure | MS Peaks |
|---|---|---|---|---|
| 10 | 1-(iso-propylaminosilyl)-2,2,4,4,6,6-hexamethylcyclotrisilazane | 306.71 | (structure) | 306, 291, 275, 261, 248, 234, 218, 203, 188, 174, 159, 146, 138, 130, 116, 100, 86, 73 |
| 11 | 1-(methylaminosilyl)-2,2,4,4,6,6-hexamethylcyclotrisilazane | 278.65 | (structure) | 277, 263, 248, 234, 219, 203, 189, 174, 160, 143, 131, 116, 100, 86, 74 |

Comparative Example 12a: Thermal Atomic Layer Deposition of Silicon Oxide Films with Hexamethyldisilazane (HMDSZ)

Atomic layer deposition of silicon oxide films was conducted using HMDSZ as the silicon precursor. The depositions were performed on the laboratory scale ALD processing tool. The silicon precursor was delivered to the chamber by vapor draw. Deposition process and parameters are provided in Table 2. Steps 1 to 6 are repeated for many cycles until a desired thickness is reached. The process parameters of the depositions and results are provided in Table 4.

TABLE 4

Thermal ALD Deposition Parameters and Deposition Results with HMDSZ

| Deposition Temperature (° C.) | Precursor Pulse (seconds) | Ozone time (seconds) | GPC (Å/cycle) |
|---|---|---|---|
| 600 | 8 s | 4 | 0.42 |
| 600 | 16 s | 4 | 0.62 |

Comparative Example 12b. PEALD Silicon Oxide Using Hexamethyldisilazane (HMDSZ) in Laminar Flow Reactor with 27.1 MHz Plasma Depositions were performed with HMDSZ as silicon precursor and $O_2$ plasma under conditions given in Table 5. HMDSZ was delivered to the chamber by 100 sccm Ar carrier gas. Steps b to e were repeated many times to get a desired thickness of silicon oxide for metrology. The film deposition parameters and deposition GPO and wafer uniformity are shown in Table 6. The deposition wafer shows bad uniformity and very low GPO.

TABLE 5

Process for PEALD Silicon Oxide Deposition in the Commercial Lateral Flow PEALD Reactor with HMDSZ

| Step | | |
|---|---|---|
| a | Introduce Si wafer to the reactor | Deposition temperature = 100° C. |
| b | Introduce silicon precursor to the reactor | Precursor pulse = 1 seconds<br>Carrier gas 100 sccm Ar;<br>Process gas Argon flow = 600 sccm<br>Reactor pressure = 3 Torr |
| c | Purge silicon precursor with inert gas (argon) | Argon flow = 600 sccm<br>Argon flow time = 4 seconds<br>Reactor pressure = 3 Torr |
| d | Oxidation using plasma | Argon flow = 600 sccm<br>Oxygen flow = 100 sccm<br>Plasma power = 800 W<br>Plasma time = 1 seconds<br>Reactor pressure = 3 Torr |
| e | Purge $O_2$ plasma | Plasma off<br>Argon flow = 600 sccm<br>Argon flow time = 2 seconds<br>Reactor pressure = 3 Torr |

TABLE 6

PEALD Silicon Oxide Film Deposition Parameters and Deposition GPC by HMDSZ

| Dep T (° C.) | Reactor Pressure (Torr) | Precursor Flow (s) | $O_2$ Plasma Time (s) | $O_2$ Plasma Power (W) | GPC (Å/cycle) | Uniformity (%) |
|---|---|---|---|---|---|---|
| 100 | 3 | 1 | 1 | 800 | 0.26 | 24 |

Example 13: Thermal Atomic Layer Deposition of Silicon Oxide Films with 2,2,4,4,6,6-Hexamethylcycotrisilazane Atomic layer deposition of silicon oxide films was conducted using 2,2,4,4,6,6-hexamethylcycotrisilazane as the silicon precursor. The depositions were performed on the laboratory scale ALD processing tool. The silicon precursor was delivered to the chamber by vapor draw. Deposition process and parameters are provided in Table 2. Steps 1 to 6 are repeated many times until a desired thickness is reached. The process parameters of the depositions and results are provided in Table 7.

TABLE 7

Thermal ALD Deposition Parameters and Deposition Results with 2,2,4,4,6,6-hexamethylcycotrisilazane

| Deposition Temperature (° C.) | Precursor Pulse (seconds) | Ozone time (seconds) | GPC (Å/cycle) |
|---|---|---|---|
| 500 | 12 | 24 | 1.69 |
| 500 | 24 | 24 | 1.89 |
| 600 | 24 | 24 | 2.06 |

Example 14. PEALD Silicon Oxide Using 2,2,4,4,6,6-Hexamethylcycotrisilazane in Laminar Flow Reactor with 27.1 MHz Plasma Depositions were performed with 2,2,4,4,6,6-hexamethylcycotrisilazane as silicon precursor and $O_2$ plasma under conditions as described in Table 8. Precursor was delivered to chamber with carrier gas Ar flow of 200 sccm. Steps b to e were repeated many times to get a desired thickness of silicon oxide for metrology. The film deposition parameters and deposition GPC are shown in Table 9. It can be seen that GPC shows saturation with precursor pulse of 8 seconds and longer.

TABLE 8

Process for PEALD Silicon Oxide Deposition in the Commercial Lateral Flow PEALD Reactor with 2,2,4,4,6,6-hexamethylcycotrisilazane

| Step | | |
|---|---|---|
| A | Introduce Si wafer to the reactor | Deposition temperature = 100° C. or 300° C. |
| B | Introduce silicon precursor to the reactor | Precursor pulse = variable seconds<br>Carrier gas 200 sccm Ar;<br>Process gas Argon flow = 300 sccm<br>Reactor pressure = 3 Torr |
| C | Purge silicon precursor with inert gas (argon) | Argon flow = 300 sccm<br>Argon flow time = 10 seconds<br>Reactor pressure = 3 Torr |
| D | Oxidation using plasma | Argon flow = 300 sccm<br>Oxygen flow = 100 sccm<br>Plasma power = 200 Watts<br>Plasma time = 5 seconds<br>Reactor pressure = 3 Torr |
| E | Purge $O_2$ plasma | Plasma off<br>Argon flow = 300 sccm<br>Argon flow time = 2 seconds<br>Reactor pressure = 3 Torr |

TABLE 9

PEALD Silicon Oxide Film Deposition Parameters and Deposition GPC by 2,2,4,4,6,6-hexamethylcycotrisilazane

| Process Condition | Dep T (° C.) | Reactor Pressure (Torr) | Precursor flow (s) | Oxygen Plasma time (s) | Oxygen Plasma Power (W) | GPC (Å/cycle) | Uniformity (%) |
|---|---|---|---|---|---|---|---|
| 1 | 300 | 3 | 1 | 5 | 200 | 0.92 | 5.2 |
| 2 | 300 | 3 | 2 | 5 | 200 | 1.14 | 3.4 |
| 3 | 300 | 3 | 4 | 5 | 200 | 1.34 | 2.6 |
| 4 | 300 | 3 | 8 | 5 | 200 | 1.50 | 2.6 |
| 5 | 300 | 3 | 16 | 5 | 200 | 1.64 | 1.7 |
| 6 | 300 | 3 | 32 | 5 | 200 | 1.57 | 1.4 |

Example 15. PEALD Silicon Oxide Using 1,2,3,4,5,6-hexamethylcycotrisilazane in Laminar Flow Reactor with 27.1 MHz Plasma Depositions were performed with 1,2,3,4,5,6-hexamethylcycotrisilazane as silicon precursor and $O_2$ plasma under conditions as described above in Table 8. Precursor was delivered to chamber with carrier gas Ar flow of 200 sccm. Steps b to e were repeated many times to get a desired thickness of silicon oxide for metrology. The film deposition parameters and deposition GPC are shown in Table 10.

TABLE 10

PEALD Silicon Oxide Film Deposition Parameters and Deposition GPC by 1,2,3,4,5,6-hexamethylcycotrisilazane

| Process Condition | Dep T (° C.) | Reactor Pressure (Torr) | Precursor flow (s) | Oxygen Plasma time (s) | Oxygen Plasma Power (W) | GPC (Å/cycle) | Uniformity (%) |
|---|---|---|---|---|---|---|---|
| 1 | 300 | 3 | 1 | 5 | 200 | 1.20 | 2.3 |
| 2 | 300 | 3 | 2 | 5 | 200 | 1.38 | 1.9 |
| 3 | 300 | 3 | 4 | 5 | 200 | 1.56 | 1.8 |
| 4 | 300 | 3 | 8 | 5 | 200 | 1.67 | 1.6 |

TABLE 10-continued

PEALD Silicon Oxide Film Deposition Parameters and Deposition GPC by 1,2,3,4,5,6-hexamethylcycotrisilazane

| Process Condition | Dep T (° C.) | Reactor Pressure (Torr) | Precursor flow (s) | Oxygen Plasma time (s) | Oxygen Plasma Power (W) | GPC (Å/cycle) | Uniformity (%) |
|---|---|---|---|---|---|---|---|
| 5 | 100 | 3 | 1 | 5 | 200 | 1.60 | 1.5 |
| 6 | 100 | 3 | 2 | 5 | 200 | 1.68 | 1.7 |
| 7 | 100 | 3 | 4 | 5 | 200 | 1.77 | 1.9 |
| 8 | 100 | 3 | 8 | 5 | 200 | 1.87 | 1.5 |

Example 16. PEALD Silicon Oxide Using 1-dimethylamino-1,2,3,4,5,6-Hexamethylcyclotrisilazane in Laminar Flow Reactor with 27.1 MHz Plasma Depositions were performed with 1-dimethylamino-1,2,3,4,5,6-hexamethylcycotrisilazane as silicon precursor and 02 plasma under conditions as described above in Table 8. Precursor was delivered to chamber with carrier gas Ar flow of 200 sccm. Steps b to e were repeated many times to get a desired thickness of silicon oxide for metrology. The film deposition parameters and deposition GPC are shown in Table 11.

TABLE 11

PEALD Silicon Oxide Film Deposition Parameters and Deposition GPC by 1-dimethylamino-1,2,3,4,5,6-hexamethylcycotrisilazane

| Process Condition | Dep T (° C.) | Reactor Pressure (Torr) | Precursor flow (s) | Oxygen Plasma time (s) | Oxygen Plasma Power (W) | GPC (Å/cycle) | Uniformity (%) |
|---|---|---|---|---|---|---|---|
| 1 | 300 | 3 | 1 | 5 | 200 | 1.12 | 4.2 |
| 2 | 300 | 3 | 2 | 5 | 200 | 1.30 | 3.4 |
| 3 | 300 | 3 | 4 | 5 | 200 | 1.47 | 2.4 |
| 4 | 300 | 3 | 8 | 5 | 200 | 1.62 | 1.5 |
| 5 | 100 | 3 | 1 | 5 | 200 | 1.55 | 2.3 |
| 6 | 100 | 3 | 2 | 5 | 200 | 1.72 | 2.8 |
| 7 | 100 | 3 | 8 | 5 | 200 | 1.95 | 2.0 |

Example 17. PEALD Silicon Nitride Using 1-dimethylamino-1,2,3,4,5,6-hexamethylcyclotrisilazane and Ar/$N_2$ Plasma A silicon containing film was deposited using 1-dimethylamino-1,2,3,4,5,6-hexamethylcyclotrisilazane as the silicon precursor and Ar/$N_2$ plasma. The silicon precursor was delivered from a container held at 55° C. using 100 sccm Ar carrier gas. The susceptor temperature was set to 300° C., and the reactor was equipped with parallel plate in-situ electrodes. Plasma frequency and power were 13.56 MHz and 200 W, respectively. Deposition process steps were carried out as described in Table 12, wherein steps b through e were repeated many times to get a desired thickness of silicon oxide for metrology.

TABLE 12

Process for PEALD Silicon Nitride Deposition in the Commercial Lateral Flow PEALD Reactor with 1-dimethylamino-1,2,3,4,5,6-hexamethylcyclotrisilazane.

| Step | | |
|---|---|---|
| a | Introduce Si wafer to the reactor | Deposition temperature = 300° C. |
| b | Introduce silicon precursor to the reactor | Precursor pulse = 1 second<br>Carrier gas = 100 sccm Ar;<br>Process gas Argon flow = 500 sccm<br>Reactor pressure = 2 Torr |
| c | Purge silicon precursor with inert gas (argon) | Argon flow = 500 sccm<br>Argon flow time = 10 seconds<br>Reactor pressure = 2 Torr |
| d | Nitridation using Ar/$N_2$ plasma | Argon flow = 125 sccm<br>Nitrogen flow = 375 sccm<br>Plasma power = 200 Watts<br>Plasma time = 5 seconds<br>Reactor pressure = 2 Torr |
| e | Purge Ar/$N_2$ plasma | Plasma off<br>Argon flow = 500 sccm<br>Argon flow time = 10 seconds<br>Reactor pressure = 2 Torr |

The resulting deposited film had a GPC of 0.24 Å/cycle with refractive index of 1.97.

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

The invention claimed is:

1. A method of depositing a silicon-containing film onto a substrate, the method comprising the steps of:
    a) providing a substrate in a reactor;
    b) introducing into the reactor at least one silicon precursor compound selected from the group consisting of 1-silyl-2,2,4,4,6,6-hexamethylcyclotrisilazane, 1-(iso-propylaminosilyl)-2,2,4,4,6,6-hexamethylcyclotrisilazane, 1-(dimethylaminosilyl)-2,2,4,4,6,6-hexamethylcyclotrisilazane, 1-(iso-propylaminosilyl)-2,2,4,4,6,6-hexamethylcyclotrisilazane, 1-(methylaminosilyl)-2,2,4,4,6,6-hexamethylcyclotrisilazane, 1-(dimethylaminomethylsilyl)-2,2,4,4,6,6-hexamethylcyclotrisilazane, 1,2,3,4,5,6-hexamethylcyclotrisilazane, 2-dimethylamino-1,2,3,4,5,6-hexamethylcyclotrisilazane, 1-(dimethylamino-methylsilyl)-2,4,6-trimethylcyclotrisilazane, 1,2,3-trisilyl-2,2,4,4,6,6-hexamethylcyclotrisilazane, 1,2,3-trisilyl-2,4,6-trimethylcyclotrisilazane, 2,2,4,4,6,6-hexamethyl-1,3-dioxa-5-aza-2,4,6-trisilacyclohexane, 2,2,4,4,5,6,6-heptamethyl-1,3-dioxa-5-aza-2,4,6-trisilacyclohexane, 5-ethyl-2,2,4,4,6,6-hexamethyl-1,3-dioxa-5-aza-2,4,6-trisilacyclohexane, 5-n-propyl-2,2,4,4,6,6-hexamethyl-1,3-dioxa-5-aza-2,4,6-trisilacyclohexane, 5-iso-propyl-2,2,4,4,6,6-hexamethyl-1,3-dioxa-5-aza-2,4,6-trisilacyclohexane, 5-silyl-2,2,4,4,6,6-hexamethyl-1,3-dioxa-5-aza-2,4,6-trisilacyclohexane, 5-methylsilyl-2,2,4,4,6,6-hexamethyl-1,3-dioxa-5-aza-2,4,6-trisilacyclohexane, 5-(dimethylaminosilyl)-2,2,4,4,6,6-hexamethyl-1,3-dioxa-5-aza-2,4,6-trisilacyclohexane, and 5-(dimethylaminomethylsilyl)-2,2,4,4,6,6-hexamethyl-1,3-dioxa-5-aza-2,4,6-trisilacyclohexane;
    c) purging the reactor with purge gas;
    d) introducing an oxygen-containing or nitrogen-containing source (or combination thereof) into the reactor; and e) purging the reactor with purge gas,
wherein steps b through e are repeated until a desired thickness of film is deposited, and
wherein the method is conducted at one or more temperatures ranging from about 25° ° C. to 600° C.

2. The method of claim 1, wherein the oxygen-containing source is selected from the group consisting of an ozone, an oxygen plasma, a plasma comprising oxygen and argon, a plasma comprising oxygen and helium, an ozone plasma, a water plasma, a nitrous oxide plasma, a carbon dioxide plasma, and combinations thereof.

3. The method of claim 1, wherein the nitrogen-containing source is selected from the group consisting of ammonia, hydrazine, monoalkylhydrazine, dialkylhydrazine, nitrogen, nitrogen/hydrogen, nitrogen/argon plasma, nitrogen/helium plasma, ammonia plasma, nitrogen plasma, nitrogen/hydrogen plasma, organic amines such as tert-butylamine, dimethylamine, diethylamine, isopropylamine, diethylamine plasma, dimethylamine plasma, trimethyl plasma, trimethylamine plasma, ethylenediamine plasma, and an alkoxyamine such as ethanolamine plasma and mixtures thereof.

4. The method of claim 1 wherein the oxygen-containing source and/or the nitrogen-containing source comprises plasma.

5. The method of claim 4 wherein the plasma is generated in situ.

6. The method of claim 4 wherein the plasma is generated remotely.

7. A film formed by the method of claim 4.

8. The method of claim 1 wherein a density of the film is about 2.1 g/cc or greater.

9. The method of claim 1 wherein the film further comprises carbon.

10. The method of claim 1 wherein a density of the film is about 1.8 g/cc or greater.

11. The method of claim 1 wherein a carbon content of the film is 0.5 atomic weight percent (at. %) as measured by X-Ray photospectroscopy or greater.

12. A film formed by the method of claim 1.

* * * * *